United States Patent
Nishihara et al.

(10) Patent No.: US 9,344,059 B2
(45) Date of Patent: May 17, 2016

(54) PIEZOELECTRIC THIN FILM RESONATOR, FILTER, AND DUPLEXER INCLUDING A FILM INSERTED INTO THE PIEZOELECTRIC FILM

(71) Applicant: TAIYO YUDEN CO., LTD., Tokyo (JP)

(72) Inventors: Tokihiro Nishihara, Tokyo (JP); Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 160 days.

(21) Appl. No.: 14/151,694

(22) Filed: Jan. 9, 2014

(65) Prior Publication Data
US 2014/0210570 A1    Jul. 31, 2014

(30) Foreign Application Priority Data

Jan. 28, 2013  (JP) ................. 2013-013415
May 16, 2013  (JP) ................. 2013-104567

(51) Int. Cl.
H03H 9/70  (2006.01)
H03H 9/02  (2006.01)
(Continued)

(52) U.S. Cl.
CPC ............. *H03H 9/70* (2013.01); *H03H 9/02015* (2013.01); *H03H 9/02118* (2013.01); *H03H 9/174* (2013.01); *H03H 9/175* (2013.01); *H03H 9/568* (2013.01); *H03H 9/588* (2013.01); *H03H 9/589* (2013.01); *H03H 9/02047* (2013.01); *H03H 9/131* (2013.01); *H03H 9/132* (2013.01)

(58) Field of Classification Search
CPC .......... H03H 9/02015; H03H 9/02047; H03H 9/02086; H03H 9/02118; H03H 9/131; H03H 9/132; H03H 9/173; H03H 9/174; H03H 9/175; H03H 9/568; H03H 9/587; H03H 9/588; H03H 9/589; H03H 9/70; H03H 9/703; H03H 9/706
USPC .......................................... 333/133, 187, 189
See application file for complete search history.

(56) References Cited

U.S. PATENT DOCUMENTS 4,456,850 A   6/1984   Inoue et al.
8,084,919 B2  12/2011  Nishihara et al.
(Continued)

FOREIGN PATENT DOCUMENTS

CN   101064499 A   10/2007
CN   101796726 A   8/2010
(Continued)

OTHER PUBLICATIONS

U.S. Appl. Nos. 14/519,803, filed on Oct. 21, 2014 and 14/527,335, filed on Oct. 29, 2014.
(Continued)

*Primary Examiner* — Barbara Summons
(74) *Attorney, Agent, or Firm* — Chen Yoshimura LLP

(57) ABSTRACT

A piezoelectric thin film resonator includes: a substrate; a piezoelectric film located on the substrate; a lower electrode and an upper electrode facing each other across at least a part of the piezoelectric film; and an insertion film that is inserted into the piezoelectric film, is located in at least a part of an outer periphery region in a resonance region in which the lower electrode and the upper electrode face each other across the piezoelectric film, and is not located in a center region of the resonance region.

18 Claims, 22 Drawing Sheets

(51) Int. Cl.
    *H03H 9/56*     (2006.01)
    *H03H 9/17*     (2006.01)
    *H03H 9/58*     (2006.01)
    *H03H 9/13*     (2006.01)

(56) References Cited

U.S. PATENT DOCUMENTS

| | | | |
|---|---|---|---|
| 9,048,812 B2 * | 6/2015 | Burak | H03H 3/04 |
| 9,099,983 B2 * | 8/2015 | Burak | H03H 9/132 |
| 2006/0071736 A1 | 4/2006 | Ruby et al. | |
| 2006/0091764 A1 * | 5/2006 | Tsutsumi | H03H 9/02118 310/324 |
| 2006/0103492 A1 | 5/2006 | Feng et al. | |
| 2006/0279382 A1 * | 12/2006 | Ohara | H03H 3/02 333/189 |
| 2007/0080611 A1 * | 4/2007 | Yamada | H01L 41/047 310/364 |
| 2007/0252476 A1 | 11/2007 | Iwaki et al. | |
| 2009/0206706 A1 * | 8/2009 | Iwaki | H03H 9/174 310/365 |
| 2010/0033063 A1 * | 2/2010 | Nishihara | H03H 9/02118 310/365 |
| 2010/0141353 A1 * | 6/2010 | Iwaki | H03H 9/02118 333/133 |
| 2010/0148636 A1 * | 6/2010 | Nishihara | H03H 9/02015 310/365 |
| 2011/0006860 A1 | 1/2011 | Hara et al. | |
| 2012/0218060 A1 * | 8/2012 | Burak | H03H 3/04 333/191 |
| 2015/0130559 A1 * | 5/2015 | Yokoyama | H01L 41/18 333/133 |
| 2015/0130561 A1 * | 5/2015 | Taniguchi | H03H 9/173 333/133 |

FOREIGN PATENT DOCUMENTS

| | | |
|---|---|---|
| CN | 101960717 A | 1/2011 |
| JP | 2006-109472 A | 4/2006 |
| JP | 2008-131194 A | 6/2008 |
| JP | 2008-219237 A | 9/2008 |

OTHER PUBLICATIONS

Chinese Office Action dated Mar. 4, 2016, in a counterpart Chinese patent application No. 201410042168.9.

* cited by examiner

PIEZOELECTRIC THIN FILM RESONATOR, FILTER, AND DUPLEXER INCLUDING A FILM INSERTED INTO THE PIEZOELECTRIC FILM

CROSS-REFERENCE TO RELATED APPLICATION

This application is based upon and claims the benefit of priority of the prior Japanese Patent Application No. 2013-013415, filed on Jan. 28, 2013, and No. 2013-104567, filed on May 16, 2013, the entire contents of which are incorporated herein by reference.

FIELD

A certain aspect of the present invention relates to a piezoelectric thin film resonator, a filter, and a duplexer.

BACKGROUND

Acoustic wave devices using a piezoelectric thin film resonator have been used as filters and duplexers of wireless devices such as mobile phones. The piezoelectric thin film resonator is structured to have a lower electrode and an upper electrode facing each other across a piezoelectric film.

Rapid spread of wireless systems results in usage of many frequency bands. This requires the skirt characteristics of a filter or a duplexer to be steep. Increasing the Q value of the piezoelectric thin film resonator is one of measures for making the skirt characteristics steep. One of the reasons that the Q value of the piezoelectric thin film resonator deteriorates is leakage of acoustic wave energy from a resonance region to the outside.

Japanese Patent Application Publication No. 2006-109472 (Patent Document 1) discloses that a Q value is improved by providing a circular band to a surface of the lower electrode or the upper electrode.

However, the structure disclosed in Patent Document 1 cannot sufficiently reduce the acoustic wave energy leaking from the resonance region to the outside. Therefore, the improvement of the Q value is insufficient.

SUMMARY OF THE INVENTION

According to an aspect of the present invention, there is provided a piezoelectric thin film resonator including: a substrate; a piezoelectric film located on the substrate; a lower electrode and an upper electrode facing each other across at least a part of the piezoelectric film; and an insertion film that is inserted into the piezoelectric film, is located in at least a part of an outer periphery region in a resonance region in which the lower electrode and the upper electrode face each other across the piezoelectric film, and is not located in a center region of the resonance region.

According to an aspect of the present invention, there is provided a filter including the above described piezoelectric thin film resonator.

According to an aspect of the present invention, there is provided a duplexer including: a transmit filter; and a receive filter, wherein at least one the transmit filter and the receive filter is the above described filter.

DETAILED DESCRIPTION

Hereinafter, a description will be given of embodiments of the present invention with reference to the attached drawings.

First Embodiment

Figure 1A:
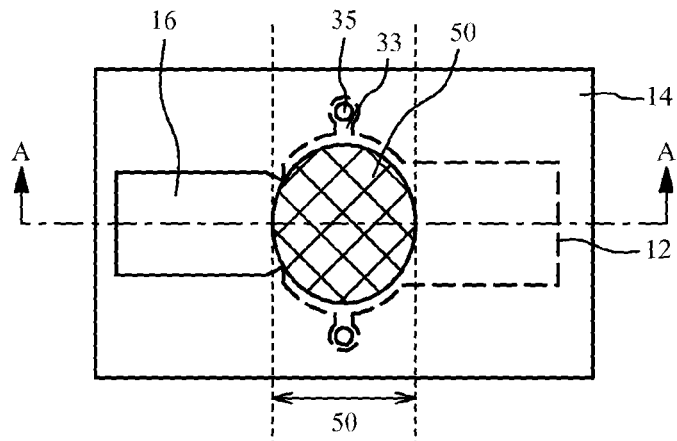
FIG. 1A is a plan view of a piezoelectric thin film resonator in accordance with a first embodiment.
Figure 1B:
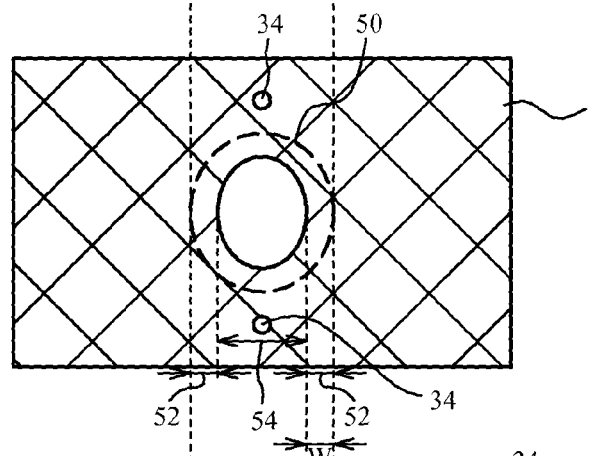
FIG. 1B is a plan view of an insertion film.
Figure 1C:
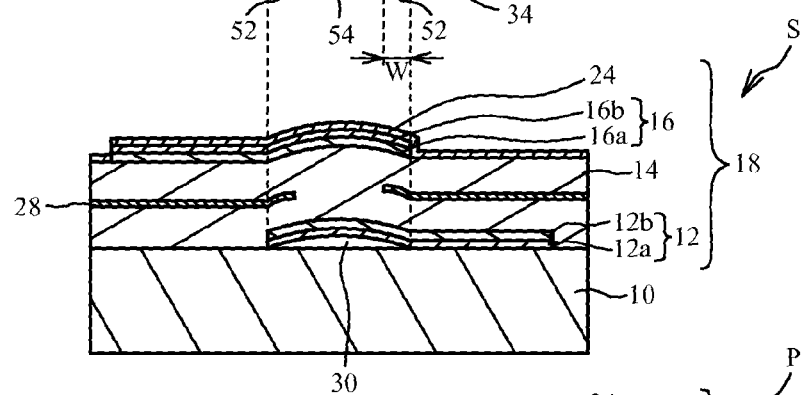
FIG. 1C and FIG. 1D are cross-sectional views taken along line A-A in FIG. 1A.
Figure 1D:
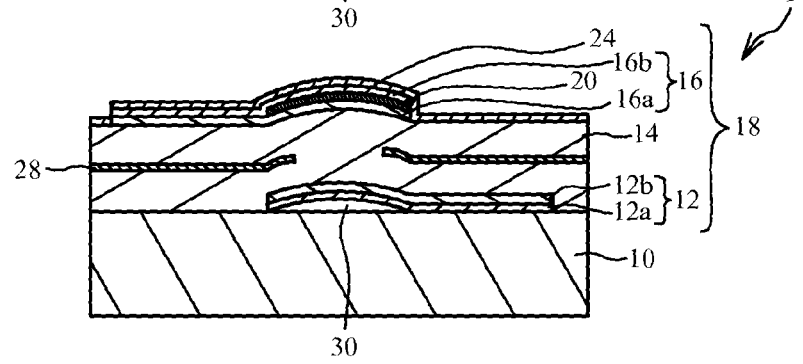

FIG. 1A is a plan view of a piezoelectric thin film resonator in accordance with a first embodiment, FIG. 1B is a plan view of an insertion film, and FIG. 1C and FIG. 1D are cross-sectional views taken along line A-A in FIG. 1A. FIG. 1C is a cross-sectional view illustrating a series resonator of, for example, a ladder-type filter and FIG. 1D is a cross-sectional view illustrating a parallel resonator of, for example, a ladder-type filter.

A description will be given of a structure of a series resonator S with reference to FIG. 1A and FIG. 1C. A lower electrode 12 is located on a substrate 10 that is a silicon (Si) substrate. An air-space 30 having a dome-shaped bulge is formed between the flat principal surface of the substrate 10 and the lower electrode 12. The dome-shaped bulge is a bulge having a shape in which the height of the air-space 30 is low near the periphery of the air-space 30 and the height of the air-space 30 increases at closer distances to the center portion of the air-space 30. The lower electrode 12 includes a lower layer 12a and an upper layer 12b. The lower layer 12a is, for example, a Cr (chrome) film, and the upper layer 12b is, for example, a Ru (ruthenium) film.

Located on the lower electrode 12 is a piezoelectric film 14 composed mainly of aluminum nitride (AlN) having a main direction of (002) direction. An insertion film 28 is located in the piezoelectric film 14. An upper electrode 16 is located on the piezoelectric film 14 so as to have a region (resonance region 50) facing the lower electrode 12 across the piezoelectric film 14. The resonance region 50 has an elliptical shape, and is a region in which an acoustic wave in a thickness extension mode resonates. The upper electrode 16 includes a lower layer 16a and an upper layer 16b. The lower layer 16a is, for example, an Ru film, and the upper layer 16b is, for example, a Cr film.

A silicon oxide film as a frequency adjusting film 24 is formed on the upper electrode 16. A multilayered film 18 in the resonance region 50 includes the lower electrode 12, the piezoelectric film 14, the insertion film 28, the upper electrode 16, and the frequency adjusting film 24. The frequency adjusting film 24 may act as a passivation film.

As illustrated in FIG. 1A, an introduction path 33 used to etch a sacrifice layer is formed in the lower electrode 12. The sacrifice layer is a layer used to form the air-space 30. The piezoelectric film 14 does not cover the vicinities of the tips of the introduction path 33, and the lower electrode 12 has hole portions 35 at the tips of the introduction path 33.

A description will be given of a structure of a parallel resonator P with reference to FIG. 1A and FIG. 1D. The parallel resonator P includes a mass load film 20 made of a Ti (titanium) layer between the layers of the upper electrode 16 in comparison with the series resonator S. Thus, the multi-layered film 18 includes the mass load film 20 formed across the whole surface in the resonance region 50 in addition to the multilayered film of the series resonator S. Other structures are the same as those of the series resonator S illustrated in FIG. 1C, and will not be described.

The difference in resonance frequency between the series resonator S and the parallel resonator P is adjusted with the film thickness of the mass load film 20. Resonance frequencies of the series resonator S and the parallel resonator P are adjusted by adjusting the film thickness of the frequency adjusting film 24.

When the piezoelectric thin film resonator has a resonance frequency of 2 GHz, the lower layer 12a made of a Cr film has a film thickness of 100 nm and the upper layer 12b made of an Ru film has a film thickness of 250 nm in the lower electrode 12. The piezoelectric film 14 made of an AlN film has a film thickness of 1100 nm. The insertion film 28 made of an Al (aluminum) film has a film thickness of 150 nm. In the upper electrode 16, the lower layer 16a made of an Ru film has a film thickness of 250 nm, and the upper layer 16b made of a Cr film has a film thickness of 50 nm. The frequency adjusting film 24 made of a silicon oxide film has a film thickness of 50 nm. The mass load film 20 made of a Ti film has a film thickness of 120 nm. The film thickness of each layer may be arbitrarily determined to obtain desired resonance characteristics.

As illustrated in FIG. 1B, the insertion film 28 is located in an outer periphery region 52 in the resonance region 50 and not located in a center region 54. The outer periphery region 52 is a region in the resonance region 50, and is a region including an outer periphery of the resonance region 50 and being along the outer periphery. The outer periphery region 52 is, for example, ring-shaped with a width. The center region 54 is a region in the resonance region 50, and is a region including the center of the resonance region 50. The center does not need to be a geometric center. The insertion film 28 is continuously located from the outer periphery region 52 to the outside of the resonance region 50. Hole portions 34 corresponding to the hole portions 35 are located in the insertion film 28.

The substrate 10 may be a quartz substrate, a glass substrate, a ceramic substrate, or a GaAs substrate instead of an Si substrate. The lower electrode 12 and the upper electrode 16 may be made of a single-layer film of Al (aluminum), Ti (titanium), Cu (copper), Mo (molybdenum), W (tungsten), Ta (tantalum), Pt (platinum), Rh (rhodium), or Ir (iridium) or a multilayered film of them instead of an Ru film and a Cr film. When the upper electrode 16 is made of a multilayered film, the insertion film 28 may be located on a boundary face of the multilayered film. For example, the lower layer 16a of the upper electrode 16 may be made of Ru, and the upper layer 16b may be made of Mo. The piezoelectric film 14 may be made of ZnO (zinc oxide), PZT (lead zirconate titanate), or PbTiO$_3$ (lead titanate) instead of aluminum nitride. In addition, the piezoelectric film 14 may be composed mainly of aluminum nitride, and include other elements to improve resonance characteristics or improve piezoelectricity. For example, the usage of Sc (scandium) as an additive element improves the piezoelectricity of the piezoelectric film 14, and thereby the effective electromechanical coupling coefficient of the piezoelectric thin film resonator is improved.

A silicon nitride film or aluminum nitride may be used as the frequency adjusting film 24 instead of a silicon oxide film. The mass load film 20 may be made of a single-layer film of Ru, Cr, Al, Cu, Mo, W, Ta, Pt, Rh, or Ir instead of Ti. In addition, an insulating film made of metal nitride such as silicon nitride or metal oxide such as silicon oxide may be used as the mass load film 20. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16. The mass load film 20 may be larger than the resonance region 50 as long as it is formed so as to include the resonance region 50.

Figure 2A:
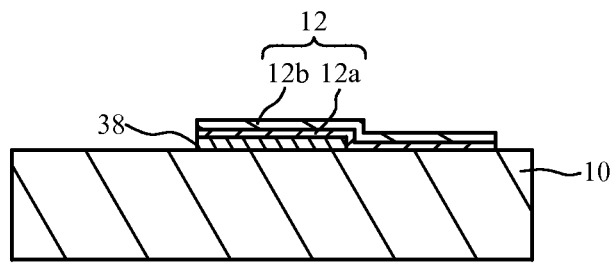
FIG. 2A through FIG. 2C are cross-sectional views illustrating a method of fabricating a series resonator in accordance with the first embodiment.
Figure 2B:
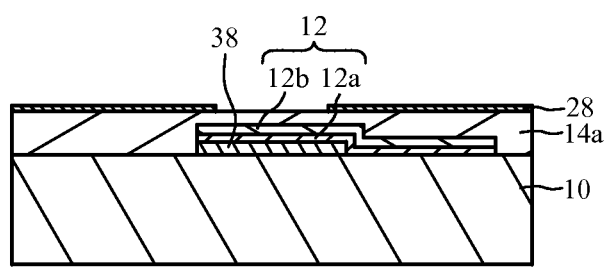
Figure 2C:
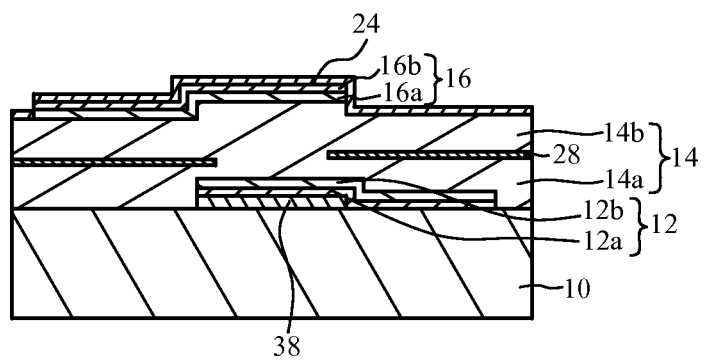

FIG. 2A through FIG. 2C are cross-sectional views illustrating a method of fabricating a series resonator in accordance with the first embodiment. As illustrated in FIG. 2A, a sacrifice layer 38 for forming the air-space is formed on the substrate 10 having a flat principal surface. The sacrifice layer 38 has a film thickness of, for example, 10 to 100 nm, and the material thereof is selected from materials such as MgO, ZnO, Ge, and $SiO_2$ that easily dissolve in an etching liquid or an etching gas. Then, the sacrifice layer 38 is patterned into a desired shape by photolithography and etching. The sacrifice layer 38 has a shape that corresponds to a planar shape of the air-space 30 and includes a region to become the resonance region 50. Next, the lower layer 12a and the upper layer 12b are formed on the sacrifice layer 38 and the substrate 10 as the lower electrode 12. The sacrifice layer 38 and the lower electrode 12 are formed by, for example, sputtering, vacuum evaporation, or CVD (Chemical Vapor Deposition). Then, the lower electrode 12 is patterned into a desired shape by photolithography and etching. The lower electrode 12 may be formed by liftoff.

As illustrated in FIG. 2B, a piezoelectric film 14a and the insertion film 28 are formed on the lower electrode 12 and the substrate 10 by, for example, sputtering, vacuum evaporation, or CVD. The insertion film 28 is patterned into a desired shape by photolithography and etching. The insertion film 28 may be formed by liftoff.

As illustrated in FIG. 2C, a piezoelectric film 14b and the lower layer 16a and the upper layer 16b of the upper electrode 16 are formed by, for example, sputtering, vacuum evaporation, or CVD. The piezoelectric film 14 is formed of the piezoelectric films 14a and 14b. The upper electrode 16 is patterned into a desired shape by photolithography and etching. The upper electrode 16 may be formed by liftoff.

In the parallel resonator illustrated in FIG. 1D, the mass load film 20 is formed by, for example, sputtering, vacuum evaporation, or CVD after the lower layer 16a is formed. The mass load film 20 is patterned into a desired shape by photolithography and etching. Then, the upper layer 16b is formed.

The frequency adjusting film 24 is formed by, for example, sputtering or CVD. The frequency adjusting film 24 is patterned into a desired shape by photolithography and etching.

Then, the etching liquid to etch the sacrifice layer 38 is introduced into the sacrifice layer 38 under the lower electrode 12 through the hole portion 35 and the introduction path 33 (see FIG. 1A). This process removes the sacrifice layer 38. The medium used to etch the sacrifice layer 38 is preferably a medium that does not etch the material of the resonators except the sacrifice layer 38. Especially, the etching medium is preferably a medium that does not etch the lower electrode 12 that makes contact with the etching medium. The stress of the multilayered film 18 (see FIG. 1C, FIG. 1D) is set to a compression stress. This causes the multilayered film 18 to bulge out to the opposite side of the substrate 10 so as to separate from the substrate 10 when the sacrifice layer 38 is removed. The air-space 30 having a dome-shaped bulge is formed between the lower electrode 12 and the substrate 10. The series resonator S illustrated in FIG. 1A and FIG. 1C and the parallel resonator P illustrated in FIG. 1A and FIG. 1D are fabricated through the above described process.

A Q value at an anti-resonance point was simulated with a finite element method while changing the material of the insertion film 28. The finite element method was performed by a two-dimensional analysis with respect to the cross-section illustrated in FIG. 1C. The film thickness and the material of each film of the multilayered film 18 were assumed to be the same as those of the corresponding film in the piezoelectric thin film resonator having a resonance frequency of 2 GHz described in FIG. 1A to FIG. 1D. That is to say, the piezoelectric film 14 was assumed to be made of AlN. The insertion film 28 was assumed to have a film thickness of 150 nm, and a width W of the insertion film 28 overlapping with the resonance region 50 was assumed to be 2 µm. The insertion film 28 was assumed to be located in the middle position in the film thickness direction of the piezoelectric film 14.

Figure 3A:
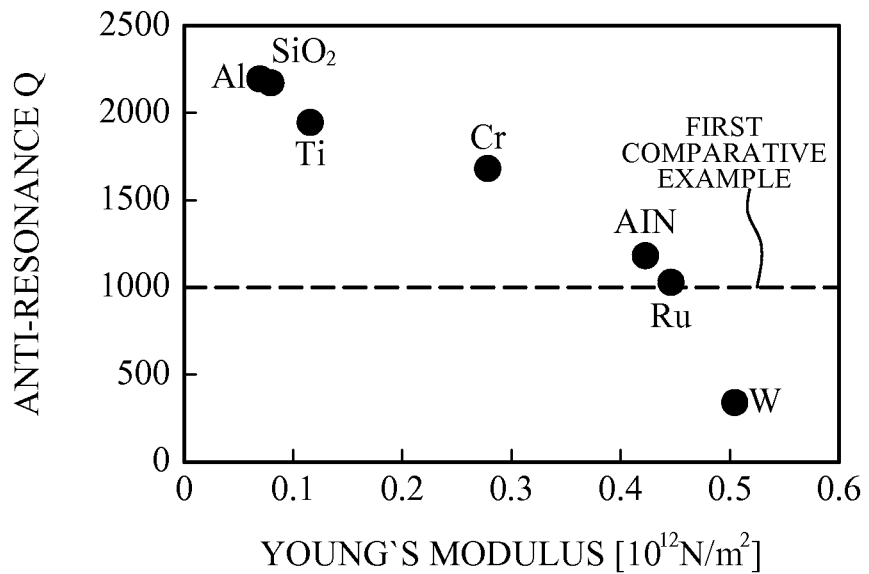
FIG. 3A is a diagram illustrating a Q value at an anti-resonance point with respect to a Young's modulus.
Figure 3B:
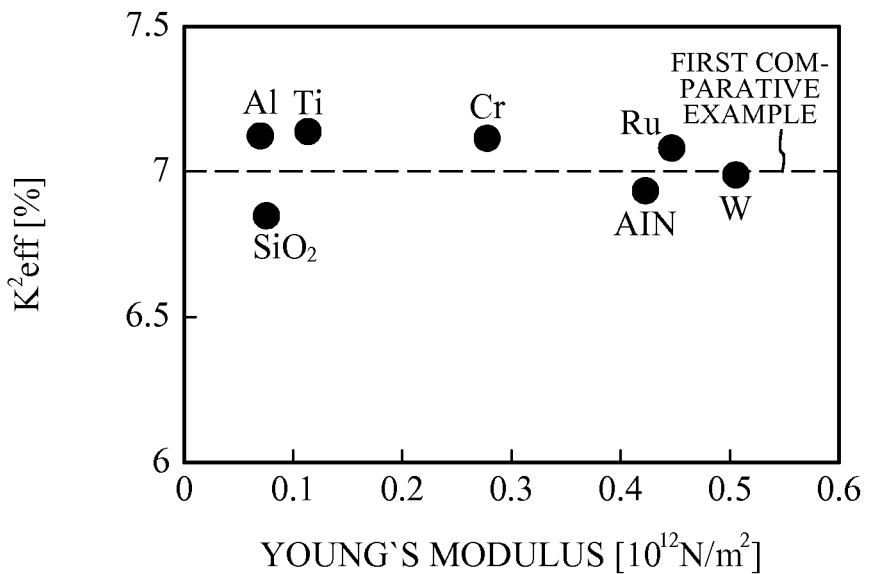
FIG. 3B is a diagram illustrating an effective electromechanical coupling coefficient $k^2$eff with respect to a Young's modulus.

FIG. 3A is a diagram illustrating a Q value at an anti-resonance point with respect to a Young's modulus, and FIG. 3B is a diagram illustrating an effective electromechanical coupling coefficient $k^2$eff with respect to a Young's modulus. The first comparative example corresponds to a resonator not including the insertion film 28. The Q value and the effective electromechanical coupling coefficient $k^2$eff were calculated with respect to Al, $SiO_2$, Ti, Cr, AlN, Ru, and W as the material of the insertion film 28.

As illustrated in FIG. 3A, the Q value at the anti-resonance point increases as the material having a lower Young's modulus is used for the insertion film 28. When the Young's modulus becomes less than that of AlN, the Q value becomes greater than that of the first comparative example. The reason is as follows. That is to say, when the insertion film 28 having a low Young's modulus is located in the outer periphery region 52, the excitation of the acoustic wave becomes small in the outer periphery region 52 of the resonance region 50. This makes the outer periphery of the resonance region 50 act as a fixed end, and thereby the acoustic wave is reflected at the fixed end. Therefore, reduced is the energy of the acoustic wave leaking to the outside of the resonance region 50. This makes the Q value high. The insertion film 28 preferably has a Young's modulus less than the Young's modulus of the piezoelectric film 14, more preferably is equal to or less than 90% of the Young's modulus of the piezoelectric film 14, and further preferably is equal to or less than 80%.

As illustrated in FIG. 3B, the effective electromechanical coupling coefficient $k^2$eff is high when the insertion film 28 is made of a metal. This is attributed to the fact that the electric field distribution of the acoustic wave in the resonance region 50 becomes uniform when the insertion film 28 is made of a metal.

Figure 4:
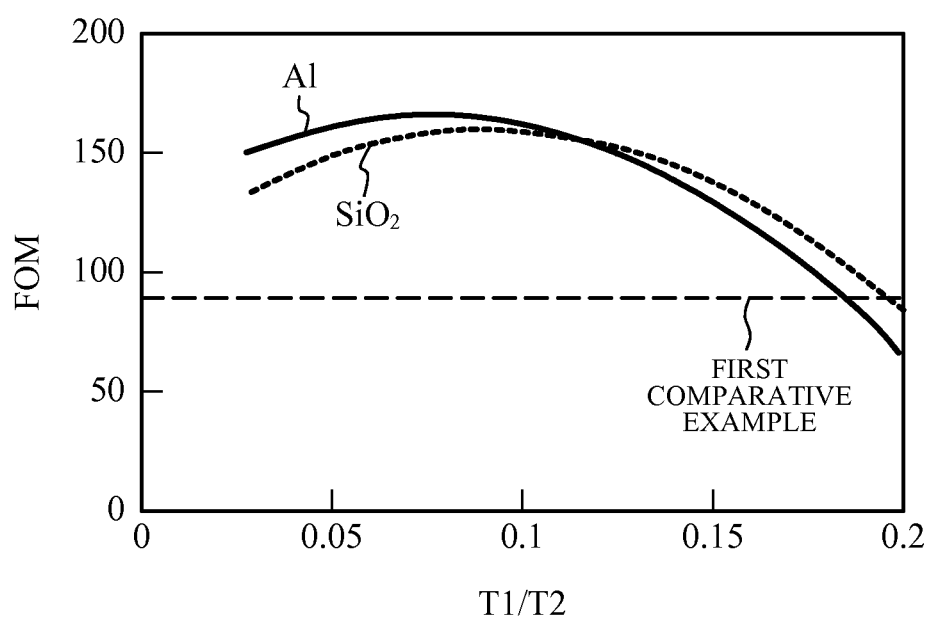
FIG. 4 is a diagram illustrating FOM with respect to T1/T2.
Figure 5:
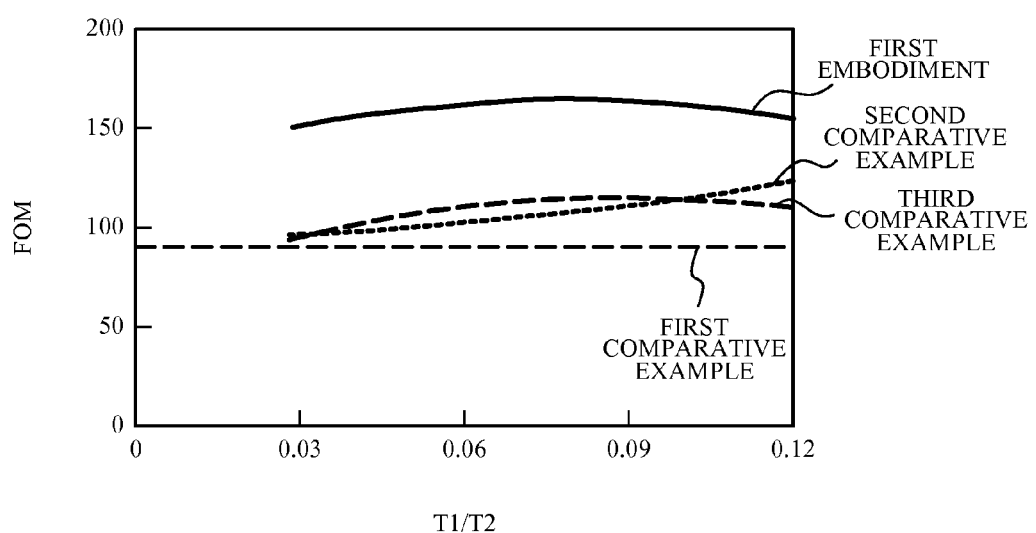
FIG. 5 is a diagram illustrating FOM with respect to T1/T2.

FIG. 4 and FIG. 5 are diagrams illustrating FOM with respect to T1/T2. The horizontal axis represents T1/T2 when the insertion film 28 has a film thickness of T1 and the multilayered film 18 in the center region 54 in the resonance region 50 has a film thickness of T2. The vertical axis represents FOM calculated from effective electromechanical coupling coefficient×√ (Q value at the resonance point×Q value at the anti-resonance point). The simulation was conducted to a case in which the insertion film 28 is made of Al or $SiO_2$, as illustrated in FIG. 4. The loss of the filter decreases as FOM increases. When T1/T2 is made to be 0.2 or less, FOM can be made to be greater than that of the first comparative example. T1/T2 is preferably 0.15 or less, and more preferably 0.1 or less. In addition, T1/T2 is preferably 0.03 or greater.

FIG. 5 illustrates simulation results when the insertion film 28 is assumed to be made of Al. A second comparative example provides the insertion film 28 to the boundary face between the piezoelectric film 14 and the lower electrode 12. A third comparative example provides the insertion film 28 to the boundary face between the piezoelectric film 14 and the upper electrode 16. As described in the first embodiment, FOM can be increased when the insertion film 28 is located in the middle position in the film thickness direction of the piezoelectric film 14. Greatest is FOM when the insertion film 28 is located in the middle position of the piezoelectric film 14. The insertion film 28 is preferably located in the piezoelectric film 14 even if it is not located in the middle position of the piezoelectric film 14. This makes FOM greater than those of the second and third comparative examples.

Figure 6:
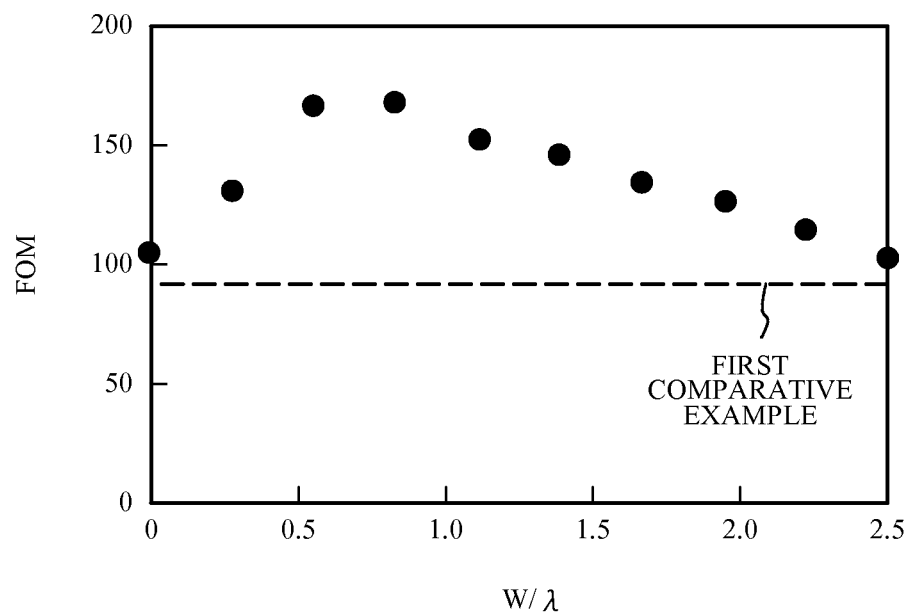
FIG. 6 is a diagram illustrating FOM with respect to a normalized width of the insertion film.

FIG. 6 is a diagram illustrating FOM with respect to a normalized width of the insertion film. The width W of the insertion film 28 is a width in a direction perpendicular to the outer periphery in the resonance region 50 (see FIG. 1B). As illustrated in FIG. 6, the simulation was conducted to a case in which the insertion film 28 is made of Al and has a film thickness of 150 nm. The width W is normalized by a wavelength λ of an acoustic wave in a thickness extension mode. Here, the wavelength λ is twice as long as the film thickness T2 of the multilayered film in the center region 54 in the resonance region 50. When W/λ is 2.5 or less, FOM is greater than that of the first comparative example. As described above, the width W of the insertion film 28 in the resonance region 50 of the insertion film 28 is preferably equal to or less than 2.5 times the wavelength λ of the acoustic wave. The width W is more preferably equal to or greater than 0.3 times and less than 1.7 times the wavelength λ. The width W is further preferably equal to or less than 1.5 times the wavelength λ.

In the first embodiment, the insertion film 28 is inserted into the piezoelectric film 14 and located in at least a part of the outer periphery region 52 in the resonance region 50. On the other hand, the insertion film 28 is not located in the center region 54 of the resonance region 50. This prevents the acoustic wave propagating in the lateral direction from leaking to the outside of the resonance region 50. Thus, the Q value is improved. In addition, FOM is improved compared to a case in which the insertion film 28 is provided to the boundary face between the lower electrode 12 or the upper electrode 16 and the piezoelectric film 14 as illustrated in FIG. 5.

Figure 7A:
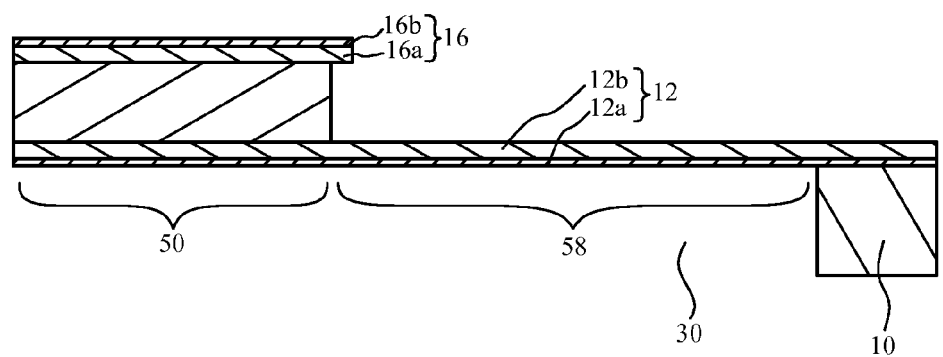
FIG. 7A and FIG. 7B are enlarged schematic views around an edge portion of a resonance region.
Figure 7B:
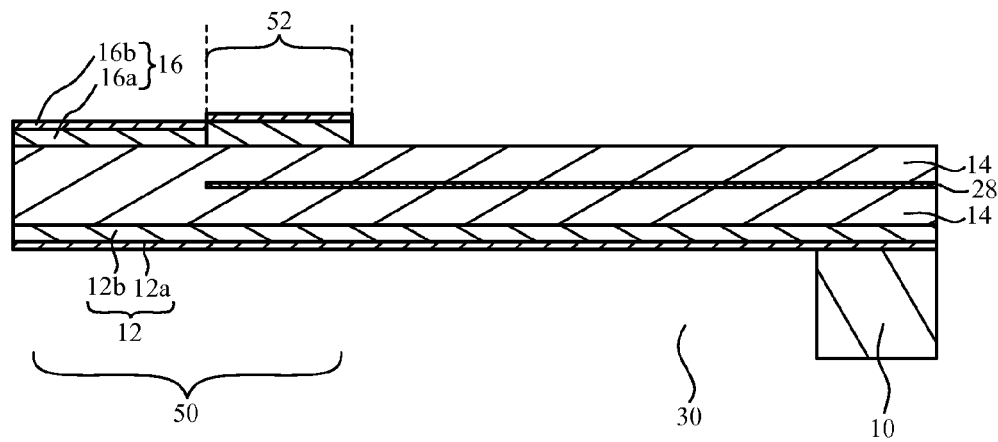

FIG. 7A and FIG. 7B are enlarged schematic views around the edge portion of the resonance region 50. In FIG. 7A, the insertion film 28 is not provided. The leakage of the acoustic wave from the resonance region 50 is prevented by removing the piezoelectric film 14 located outside the resonance region 50. FIG. 7B corresponds to the first embodiment. As illustrated in FIG. 7A and FIG. 7B, the air-space 30 is larger than the resonance region 50 to improve the Q value. Thus, in FIG. 7A, the multilayered film of the resonance region 50 is supported by the lower electrode 12 in a region 58 in which the piezoelectric film 14 is removed. Thus, cracks are easily produced in the lower electrode 12. The lower electrode 12 is thin especially in the piezoelectric thin film resonator supporting high frequency, and thus cracks are easily produced.

As illustrated in FIG. 7B, the piezoelectric film 14 and the insertion film 28 are provided in the region 58 in addition to the lower electrode 12 by providing the insertion film 28. Therefore, cracks are prevented from being produced in the lower electrode 12. Furthermore, cracks are prevented from being produced in the piezoelectric film 14 compared to a case in which the insertion film 28 is not provided and the piezoelectric film 14 is provided in the region 58.

As described above, the insertion film 28 is preferably located from at least a part of the outer periphery region 52 to the outside of a resonance region 50. This prevents cracks from being produced in the piezoelectric film 14 in the outer periphery of the resonance region 50. The insertion film 28 is preferably located above the air-space 30 and outside the resonance region 50. The effect to prevent crack production described above is effective especially to a case in which the film thickness is thin to support a high frequency band greater than or equal to 2.5 GHz.

As illustrated in FIG. 3A, the Young's modulus of the insertion film 28 is preferably less than that of the piezoelectric film 14. This improves the Q value. In addition, as illustrated in FIG. 3B, the effective electromechanical coupling coefficient can be improved by making the insertion film 28 formed of a metal film. Furthermore, when the piezoelectric film 14 is composed mainly of aluminum nitride, the insertion film 28 is preferably composed mainly of at least one of Al, Au, Cu, Ti, Pt, Ta, Cr, and silicon oxide.

Second Embodiment

Figure 8A:
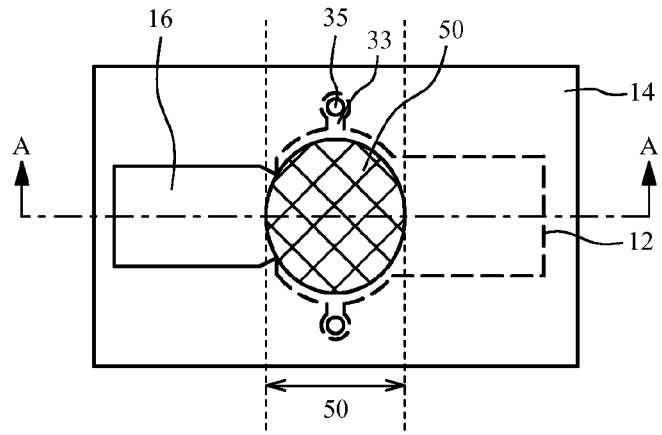
FIG. 8A is a plan view of a piezoelectric thin film resonator in accordance with a second embodiment.
Figure 8B:
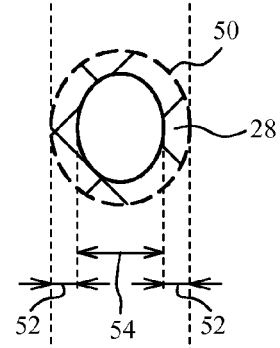
FIG. 8B is a plan view of an insertion film.
Figure 8C:
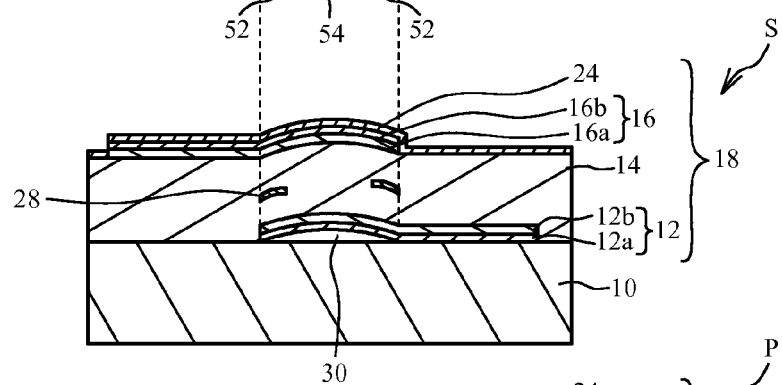
FIG. 8C and FIG. 8D are cross-sectional views taken along line A-A in FIG. 8A.
Figure 8D:
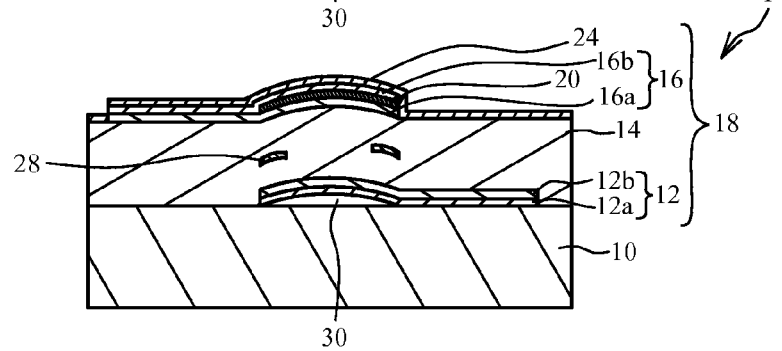

FIG. 8A is a plan view of a piezoelectric thin film resonator in accordance with a second embodiment, FIG. 8B is a plan view of an insertion film, and FIG. 8C and FIG. 8D are cross-sectional views taken along line A-A in FIG. 8A. FIG. 8C is a cross-sectional view illustrating a series resonator of, for example, a ladder-type filter, and FIG. 8D is a cross-sectional view illustrating a parallel resonator of, for example, a ladder-type filter. As illustrated in FIG. 8A through FIG. 8D, the insertion film 28 is located in the resonance region 50 and is not located outside the resonance region 50. Other structures are the same as those of the first embodiment, and will not be described.

The Q value can be improved even when the insertion film 28 is not located outside the resonance region 50 as described in the second embodiment.

Third Embodiment

Figure 9A:
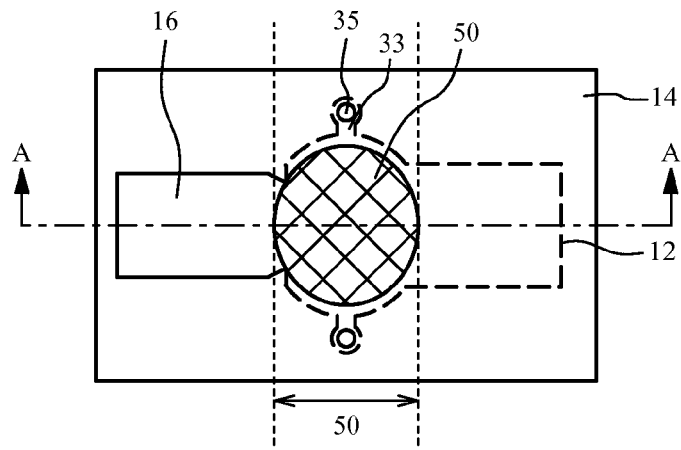
FIG. 9A is a plan view of a piezoelectric thin film resonator in accordance with a third embodiment.
Figure 9B:
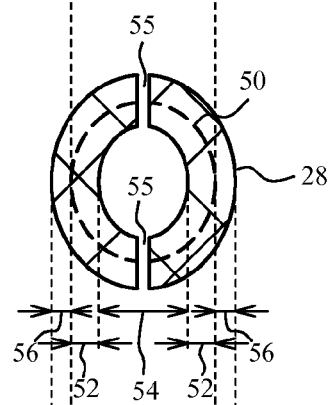
FIG. 9B is a plan view of an insertion film, and FIG. 9C are cross-sectional views taken along line A-A in FIG. 9A.
Figure 9C:
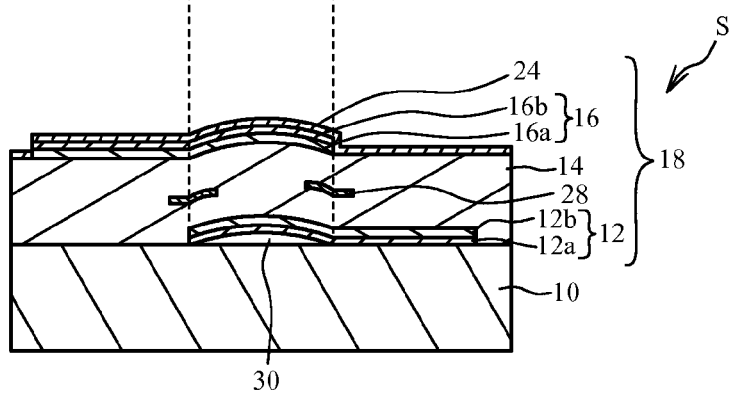

FIG. 9A is a plan view of a piezoelectric thin film resonator in accordance with a third embodiment, FIG. 9B is a plan view of an insertion film, and FIG. 9C is a cross-sectional view taken along line A-A in FIG. 9A. FIG. 9C is a cross-sectional view illustrating a series resonator of, for example, a ladder-type filter. As illustrated in FIG. 9A through FIG. 9C, the insertion film 28 is located in a part of the outer periphery region 52, and the insertion film 28 is not located in a part 55 of the outer periphery region 52. In addition, the insertion film 28 is located in a region 56 surrounding the resonance region 50 in addition to in the outer periphery region 52. Other structures are the same as those of the second embodiment, and will not be described.

As described in the third embodiment, it is sufficient if the insertion film 28 is located in a part of the outer periphery region 52. Even when the insertion film 28 is located in a part of the outer periphery region 52, the leakage of the acoustic wave to the outside of the resonance region 50 can be prevented. The insertion film 28 is preferably located in 50% or more of the outer periphery of the resonance region 50, more preferably 75% or more, and further preferably 90% or more. The insertion film 28 is preferably located so as to include a region of the air-space 30 located outside the resonance region 50. This prevents cracks from being produced in the piezoelectric film 14 or the lower electrode 12.

Fourth Embodiment

Figure 10A:
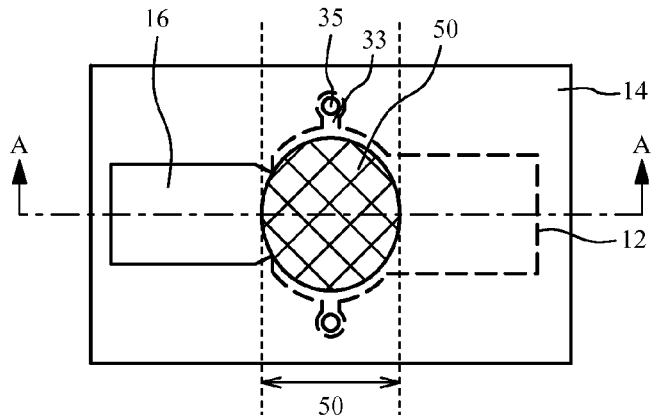
FIG. 10A is a plan view of a piezoelectric thin film resonator in accordance with a fourth embodiment.
Figure 10B:
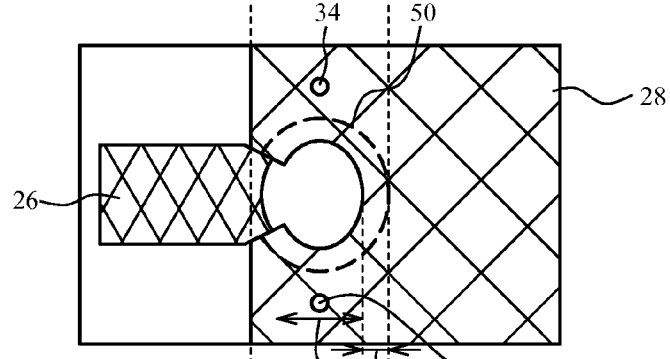
FIG. 10B is a plan view of an insertion film and an additional film.
Figure 10C:
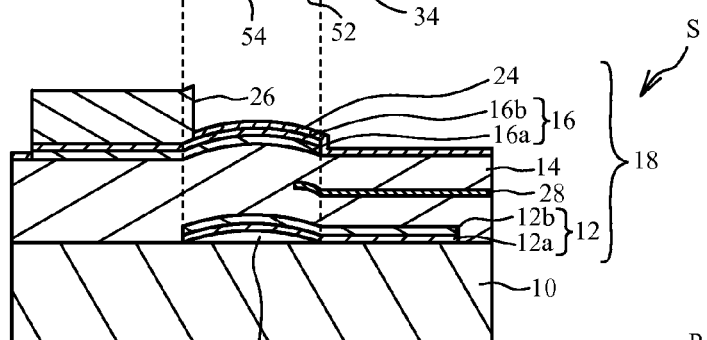
FIG. 10C and FIG. 10D are cross-sectional views taken along line A-A in FIG. 10A.
Figure 10D:
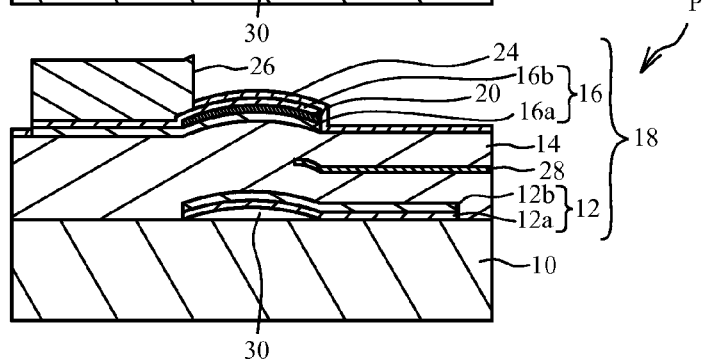

FIG. 10A is a plan view of a piezoelectric thin film resonator in accordance with a fourth embodiment, FIG. 10B is a plan view of an insertion film and an additional film, and FIG. 10C and FIG. 10D are cross-sectional views taken along line A-A in FIG. 10A. FIG. 10C is a cross-sectional view illustrating a series resonator of, for example, a ladder-type filter, and FIG. 10D is a cross-sectional view illustrating a parallel resonator of, for example, a ladder-type filter. As illustrated in FIG. 10A through FIG. 10D, the insertion film 28 is located in the outer periphery region 52 that overlaps with the lower electrode 12. An additional film 26 is located on the upper electrode 16. The additional film 26 is formed by stacking a Ti film and an Au film in this order from the bottom side. The additional film 26 prevents the acoustic wave from leaking to the outside of the resonance region 50. The additional film 26 may be made of other metals.

As described in the fourth embodiment, the insertion film 28 may be located in a part of the outer periphery region 52, and the additional film 26 may be located in a region other than the region in which the insertion film 28 is located of the outer periphery region 52. The insertion film 28 and the additional film 26 preferably surround the whole of the outer periphery of the center region 54. The insertion film 28 and the additional film 26 may surround a part of the outer periphery of the center region 54.

Fifth Embodiment

Figure 11A:
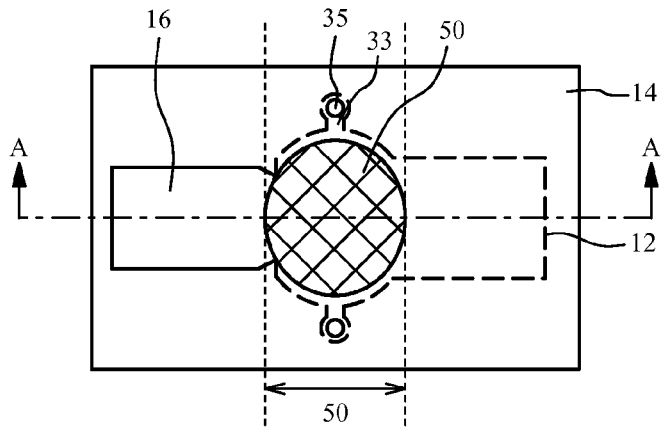
FIG. 11A is a plan view of a piezoelectric thin film resonator in accordance with a fifth embodiment.
Figure 11B:
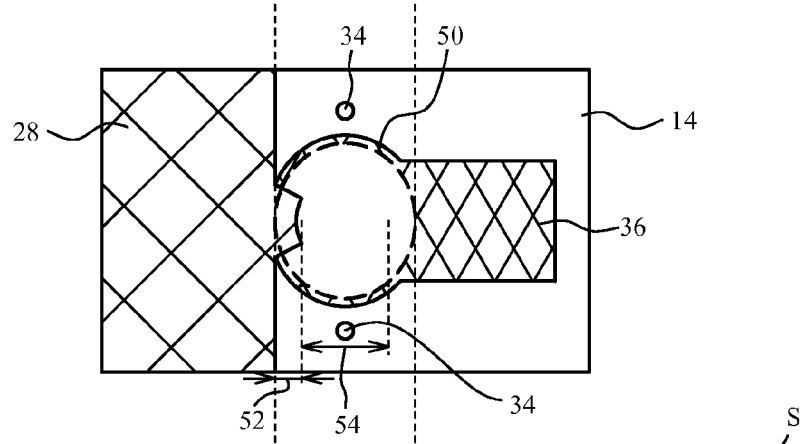
FIG. 11B is a plan view of an insertion film and an aperture.
Figure 11C:
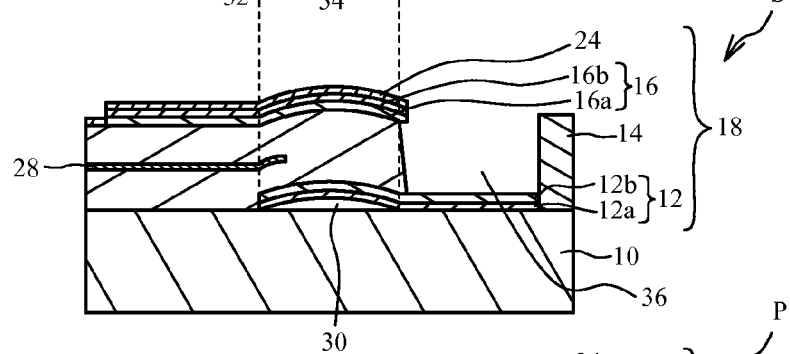
FIG. 11C and FIG. 11D are cross-sectional views taken along line A-A in FIG. 11A.
Figure 11D:
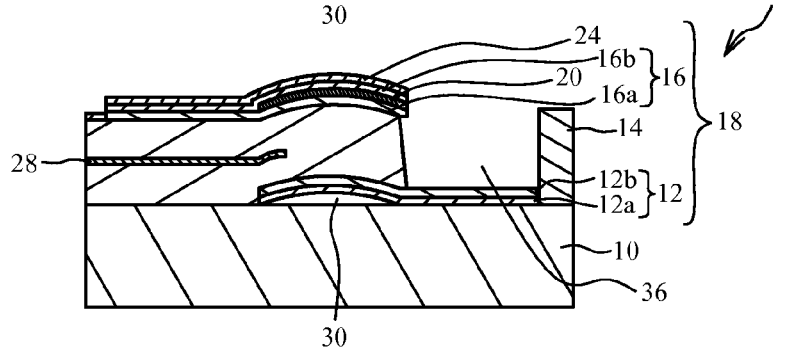

FIG. 11A is a plan view of a piezoelectric thin film resonator in accordance with a fifth embodiment, FIG. 11B is a plan view of an insertion film and an aperture, and FIG. 11C and FIG. 11D are cross-sectional views taken along line A-A in FIG. 11A. FIG. 11C is a cross-sectional view illustrating a series resonator of, for example, a ladder-type filter, and FIG. 11D is a cross-sectional view illustrating a parallel resonator of, for example, a ladder-type filter. As illustrated in FIG. 11A through FIG. 11D, the insertion film 28 is located in the outer periphery region 52 that overlaps with the upper electrode 16. The piezoelectric film 14 on the lower electrode 12 is removed to form an aperture 36. The piezoelectric film 14 is removed so that the upper electrode 16 forms an eave. The aperture 36 prevents the acoustic wave from leaking to the outside of the resonance region 50. The aperture 36 may be located on other than the lower electrode 12 as long as it is located outside the resonance region 50.

As described in the fifth embodiment, the insertion film 28 may be located in a part of the outer periphery region 52, and the aperture 36 of the piezoelectric film 14 may be located outside of a region other than the region in which the insertion film 28 is located of the outer periphery region 52. The insertion film 28 and the aperture 36 preferably surround the whole of the outer periphery of the center region 54. The insertion film 28 and the aperture 36 may surround a part of the outer periphery of the center region 54.

Sixth Embodiment

Figure 12A:
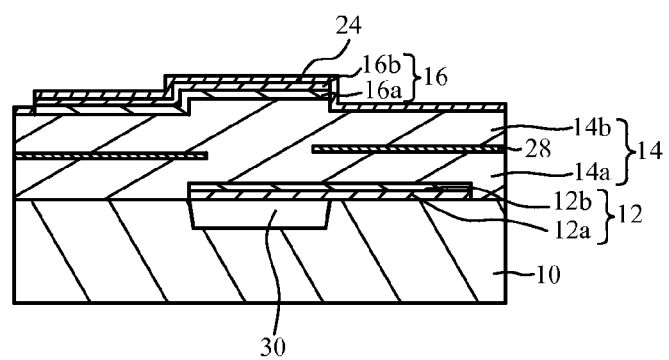
FIG. 12A is a cross-sectional view of a piezoelectric thin film resonator in accordance with a sixth embodiment.
Figure 12B:
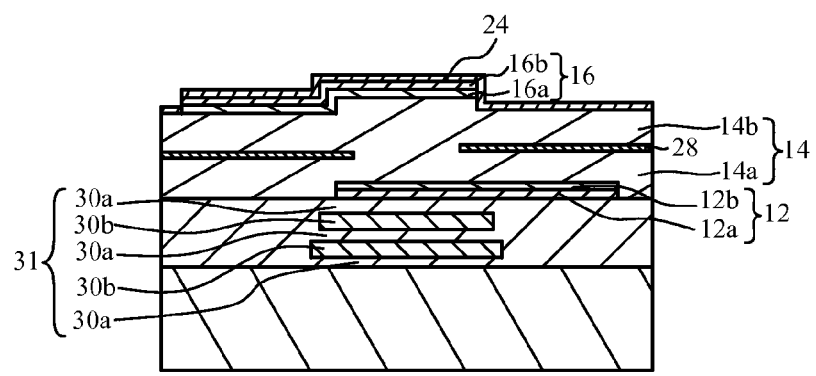
FIG. 12B is a cross-sectional view of a piezoelectric thin film resonator in accordance with a variation of the sixth embodiment.

A sixth embodiment changes a structure of the air-space. FIG. 12A is a cross-sectional view of a piezoelectric thin film resonator in accordance with the sixth embodiment, and FIG. 12B is a cross-sectional view of a piezoelectric thin film resonator in accordance with a variation of the sixth embodiment. As illustrated in FIG. 12A, a recessed portion is formed in the upper surface of the substrate 10. The lower electrode 12 is formed on the substrate 10 so as to be flat. This forms the air-space 30 in the recessed portion of the substrate 10. The air-space 30 is formed so as to include the resonance region 50. Other structures are the same as those of the first embodiment, and will not be described. The air-space 30 may be formed so as to pierce through the substrate 10. An insulating film may be formed so as to make contact with the bottom surface of the lower electrode 12. That is to say, the air-space 30 may be formed between the substrate 10 and the insulating film making contact with the lower electrode 12. The insulating film may be, for example, an aluminum nitride film.

As illustrated in FIG. 12B, an acoustic reflection film 31 is formed under the lower electrode 12 in the resonance region 50. The acoustic reflection film 31 is formed by alternately stacking a film 30a having low acoustic impedance and a film 30b having high acoustic impedance. The films 30a and 30b have film thicknesses of, for example, $\lambda/4$ ($\lambda$ is the wavelength of the acoustic wave). The stacking numbers of the film 30a and the film 30b may be arbitrarily determined. Other structures are the same as those of the first embodiment, and will not be described.

In the sixth embodiment and the variation thereof, the insertion film 28 may be located only in the resonance region 50 as with the second embodiment. In addition, as with the third embodiment, the insertion film 28 may be located only in a part of the outer periphery region 52. As with the fourth embodiment, the additional film 26 may be provided, and as with the fifth embodiment, the aperture 36 may be provided.

As described in the first through sixth embodiments, the piezoelectric thin film resonator may be an FBAR (Film Bulk Acoustic Resonator) including the air-space 30 formed between the substrate 10 and the lower electrode 12 in the resonance region 50. In addition, as described in the variation of the sixth embodiment, the piezoelectric thin film resonator may be an SMR (Solidly Mounted Resonator) including the acoustic reflection film 31 reflecting the acoustic wave propagating through the piezoelectric film 14 under the lower electrode 12 in the resonance region 50.

In the first through sixth embodiments and the variation thereof, the resonance region 50 has an elliptical shape, but may have other shapes. For example, the resonance region 50 may have a polygonal shape such as a quadrangular shape or a pentagonal shape.

Seventh Embodiment

Figure 13:
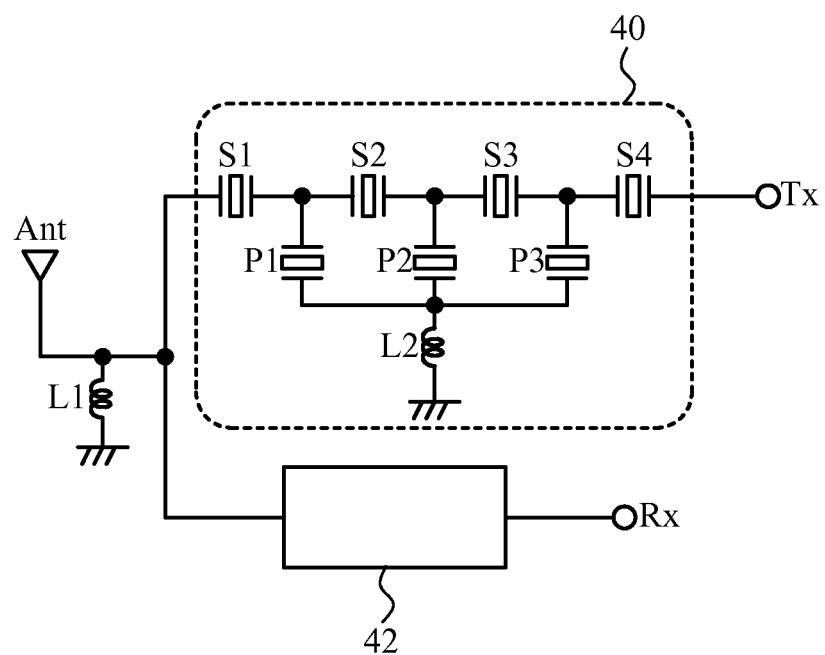
FIG. 13 is a circuit diagram of a duplexer in accordance with a seventh embodiment.

A seventh embodiment is an exemplary duplexer. FIG. 13 is a circuit diagram of a duplexer in accordance with the seventh embodiment. As illustrated in FIG. 13, the duplexer includes a transmit filter 40 and a receive filter 42. The transmit filter 40 is connected between a common terminal Ant and a transmit terminal Tx. The receive filter 42 is connected between the common terminal Ant and a receive terminal Rx. An inductor L1 as a matching circuit is located between the common terminal Ant and a ground. The transmit filter 40 passes a signal in a transmit band out of signals input from the transmit terminal Tx to the common terminal Ant as a transmission signal, and suppresses signals with other frequencies. The receive filter 42 passes a signal in a receive band out of signals input from the common terminal Ant to the receive terminal Rx as a reception signal, and suppresses a signal with other frequencies. The inductor L1 matches impedance so that the transmission signal transmitted through the transmit filter 40 is output from the common terminal Ant without leaking to the receive filter 42.

The transmit filter 40 is a ladder-type filter. One or more series resonators S1 through S4 are connected in series between the transmit terminal Tx (input terminal) and the common terminal Ant (output terminal). One or more parallel resonators P1 through P3 are connected in parallel between the transmit terminal Tx and the common terminal Ant. Ground side ends of the parallel resonators P1 through P3 are unified and grounded through the inductor L2. The number of the series resonators, the parallel resonators, and the inductors or the connection thereof can be arbitrarily changed to obtain desired transmit filter characteristics. At least one of the series resonators S1 through S4 and the parallel resonators P1 through P3 may be any one of the piezoelectric thin film resonators of the first through sixth embodiments and the variation thereof.

Figure 14A:
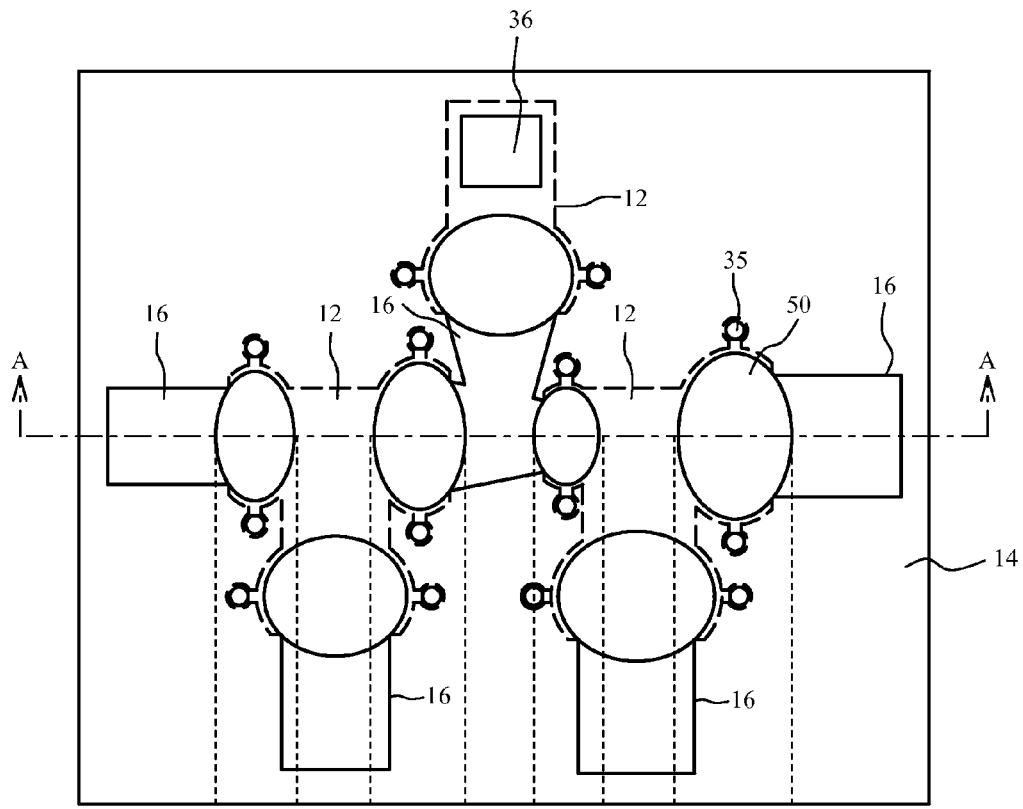
FIG. 14A is a plan view of a transmit filter.
Figure 14B:
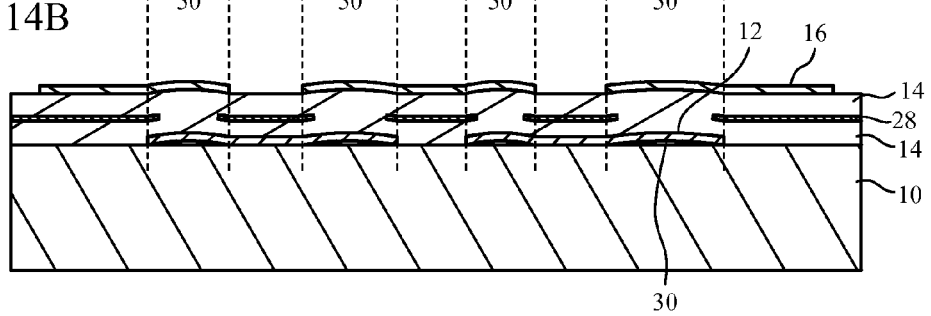
FIG. 14B is a cross-sectional view taken along line A-A in FIG. 14A.
Figure 15:
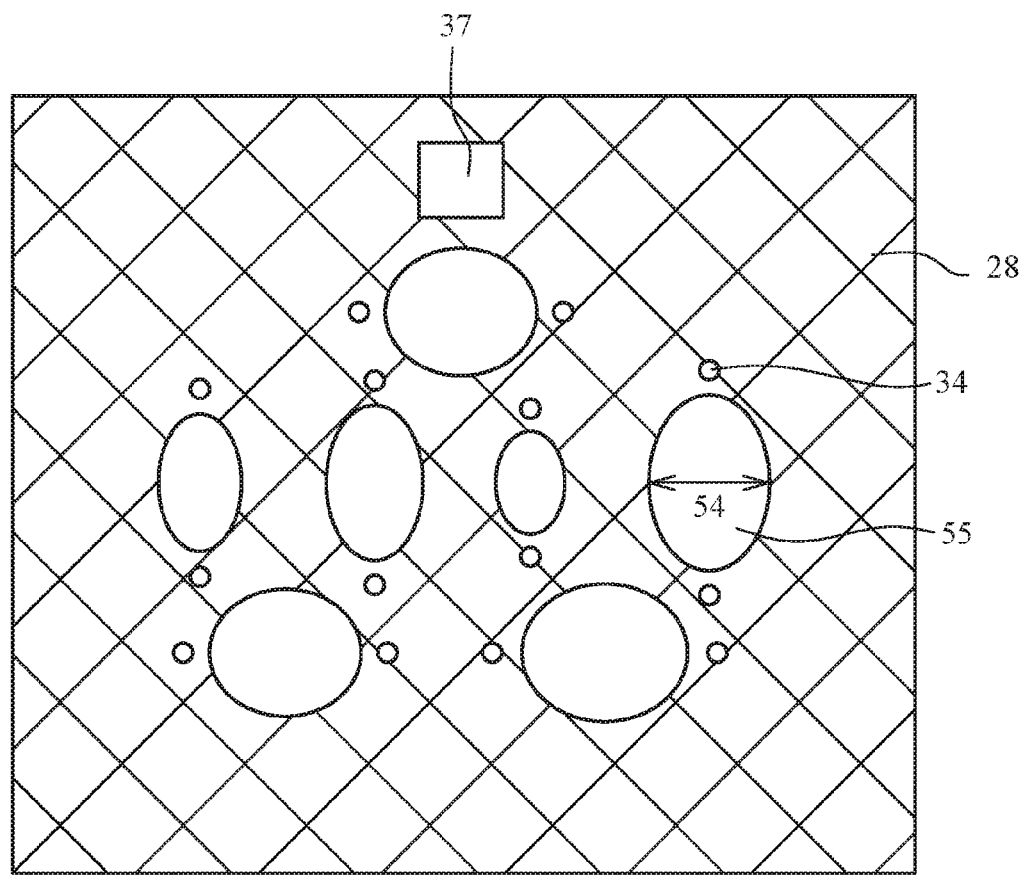
FIG. 15 is a plan view of an insertion film of the transmit filter.

FIG. 14A is a plan view of the transmit filter, and FIG. 14B is a cross-sectional view taken along line A-A in FIG. 14A. FIG. 15 is a plan view of an insertion film of the transmit filter. As illustrated in FIG. 14A and FIG. 14B, the piezoelectric thin film resonators of the first embodiment are formed on the single substrate 10 to form a ladder-type filter. The aperture 36 is formed in the piezoelectric film 14, and an aperture 37 is formed in the insertion film 28. The electrical connection to the lower electrode 12 can be provided through the apertures 36 and 37. Other structures are the same as those of the first embodiment, and will not be described. The size and the shape of the resonance region 50 of each of the resonators S1 through S4 and P1 through P3 can be arbitrarily changed.

The receive filter 42 may be a ladder-type filter or a multimode filter. At least one of the transmit filter 40 and the receive filter 42 may be a ladder-type filter or a lattice-type filter. At least one of resonators in at least one of the transmit filter 40 and the receive filter 42 may be any one of the piezoelectric thin film resonators of the first through sixth embodiments and the variation thereof.

The filter includes any one of the piezoelectric thin film resonators of the first through sixth embodiments and the variation thereof. This improves the Q value of the resonator, and thereby the skirt characteristics of the filter can be improved.

In addition, at least one of the transmit filter 40 and the receive filter 42 may be a filter including any one of the piezoelectric thin film resonators of the first through sixth embodiments and the variation thereof.

Eighth Embodiment

Figure 16:
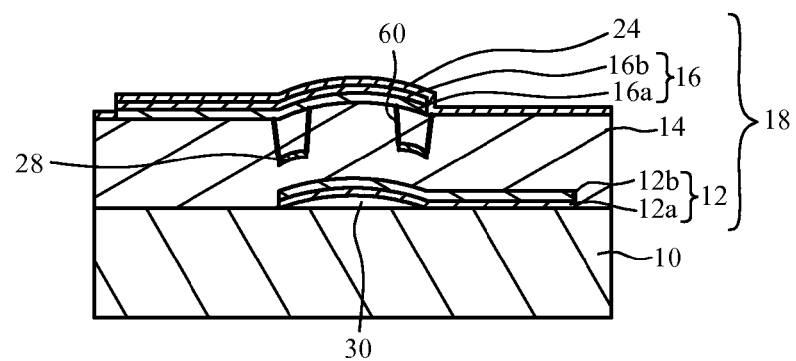
FIG. 16 is a cross-sectional view of a fabricated piezoelectric thin film resonator in accordance with the second embodiment.

An eighth embodiment makes the side surface of the insertion film 28 tapered. FIG. 16 is a cross-sectional view of the fabricated piezoelectric thin film resonator of the second embodiment. The film thicknesses of the layers are as follows. In the lower electrode 12, the lower layer 12a made of a Cr film has a film thickness of 100 nm and the upper layer 12b made of an Ru film has a film thickness of 200 nm. The piezoelectric film 14 made of an AlN film has a film thickness of 1200 nm. The insertion film 28 made of a silicon oxide film has a film thickness of 150 nm. In the upper electrode 16, the lower layer 16a made of an Ru film has a film thickness of 250 nm, and the upper layer 16b made of a Cr film has a film thickness of 50 nm. The frequency adjusting film 24 made of a silicon oxide film has a film thickness of 50 nm. A crack 60 is produced in the piezoelectric film 14 from the edge of the insertion film 28.

Figure 17:
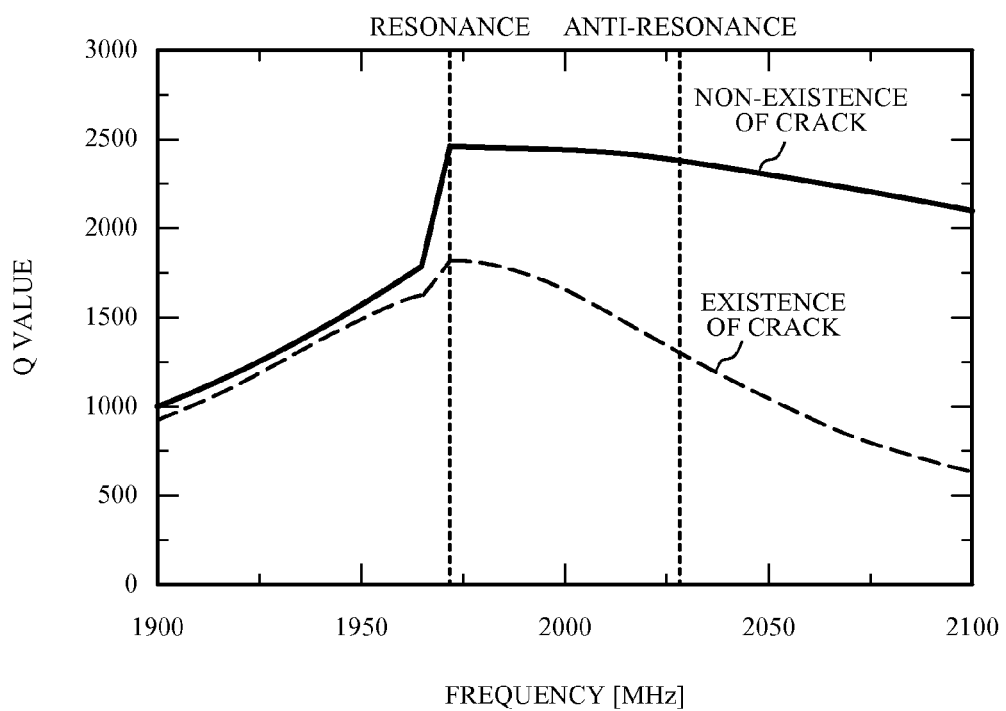
FIG. 17 is a diagram illustrating a Q value in cases of existence and non-existence of cracks with respect to a frequency.

To examine the effect of the crack, the Q value was simulated in cases in which the crack 60 exists and does not exist in the structure illustrated in FIG. 16. The simulation was conducted with a finite element method. FIG. 17 is a diagram illustrating a Q value in cases of existence and non-existence of cracks with respect to a frequency. As illustrated in FIG. 17, a Q value in the case in which a crack exists is lower than that in the case in which a crack does not exist. A Q value is low due to a crack especially in frequencies higher than the frequency of the resonance point.

Figure 18A:
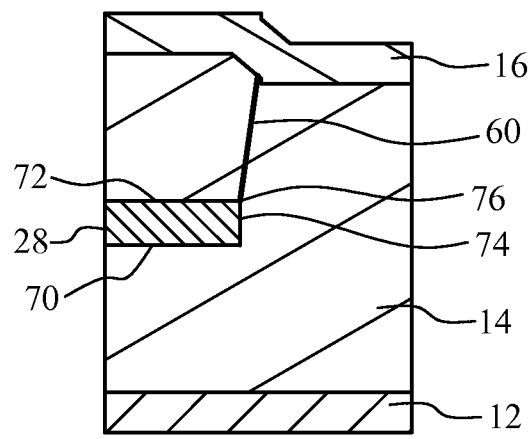
FIG. 18A and FIG. 18B are enlarged views of edge portions of insertion films in accordance with a fourth comparative example and an eighth embodiment, respectively.
Figure 18B:
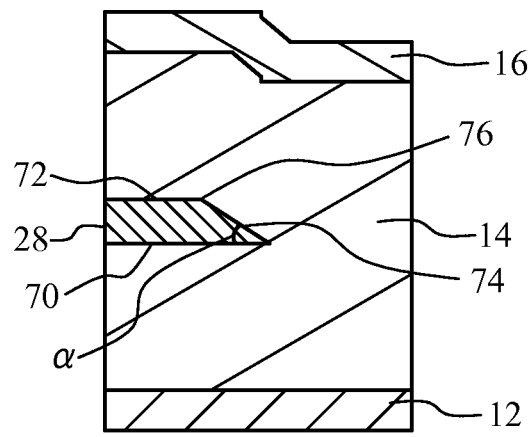

FIG. 18A and FIG. 18B are enlarged views of edge portions of insertion films in accordance with a fourth comparative example and the eighth embodiment, respectively. As illustrated in FIG. 18A, when a side surface 74 of the insertion film 28 is formed so as to be approximately perpendicular to a bottom surface 70 and an upper surface 72, the crack 60 is produced from a corner 76 at which the side surface 74 intersects with the upper surface 72. As illustrated in FIG. 18B, the side surface 74 is formed so as to have a tapered shape so that the upper surface 72 is smaller than the bottom surface 70. A taper angle α between the side surface 74 and the bottom surface is an acute angle. That is to say, an angle between the side surface 74 and the upper surface 72 is an obtuse angle. Thus, production of cracks from the corner 76 can be prevented.

When the insertion film 28 is processed in the FIG. 2B, the insertion film 28 is processed so that the side surface 74 thereof has a tapered shape. The insertion film 28 is processed by, for example, dry etching or wet etching. The taper angle α can be arbitrarily set by properly changing etching condition and/or etching mask condition.

Figure 19:
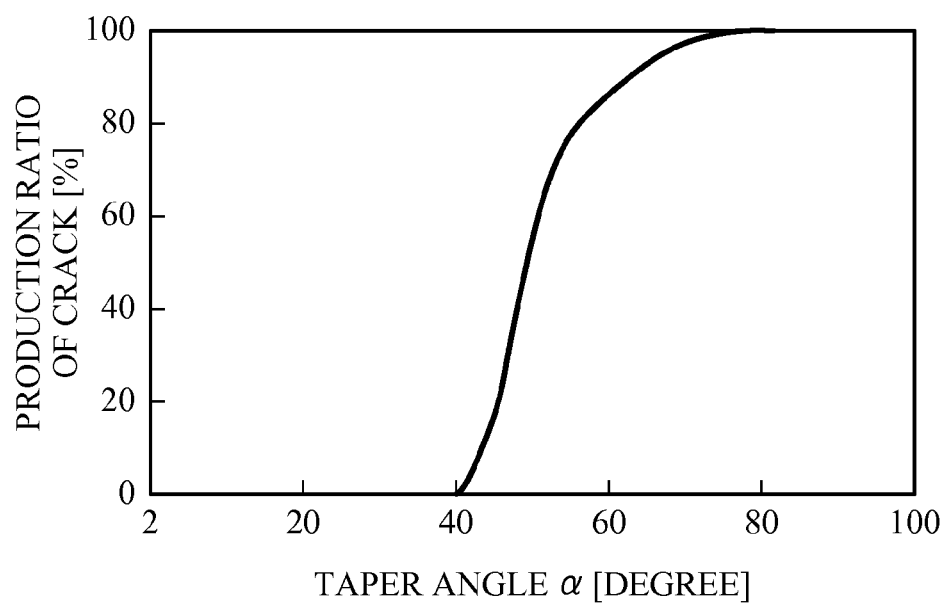
FIG. 19 is a diagram illustrating a production ratio of crack with respect to an angle $\alpha$.

FIG. 19 is a diagram illustrating a production ratio of crack with respect to an angle α. Samples with different taper angles α were fabricated, and the cross-sections of the fabricated samples were observed with an SEM (scanning electron microscope). Samples in which a crack was observed are defined as crack produced samples among the samples. A ratio of the crack produced samples to the observed samples is a production ratio of crack. The solid line of FIG. 19 is an approximated line of measurement points. As illustrated in FIG. 19, when the taper angle α exceeds 60°, the production ratio of crack exceeds 80%. Thus, the taper angle α is preferably 60° or less. When the taper angle is 40° or less, the production ratio of crack is approximately 0%. Therefore, the taper angle α is more preferably 40° or less.

Figure 20:
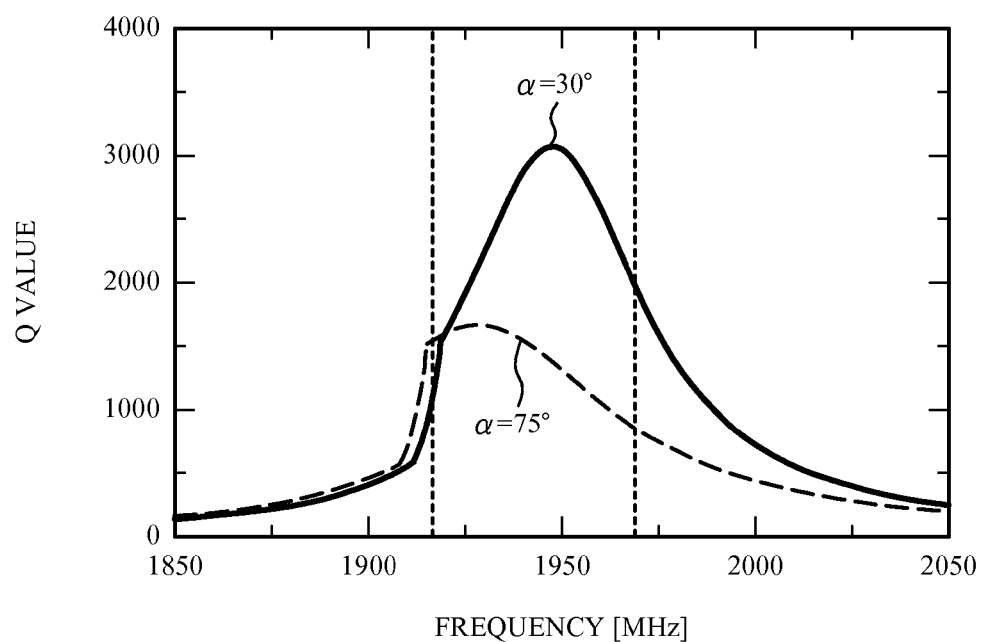
FIG. 20 is a diagram illustrating a Q value with respect to a frequency in cases of $\alpha=30°$ and $\alpha=75°$.

The piezoelectric thin film resonators having the structure illustrated in FIG. 16 and a taper angle α of 30° and 75° were fabricated, and the Q value thereof were measured. Cracks are produced in the sample with a taper angle α of 75°, and cracks are not produced in the sample with a taper angle α of 30°. Each film thickness is as described in FIG. 16. The resonance region 50 has an elliptical shape having 225 μm of a main axis and 140 μm of a secondary axis. W/λ is 0.7. FIG. 20 is a diagram illustrating a Q value with respect to a frequency when α is 30° and 75°. As illustrated in FIG. 20, the Q value of the sample with a taper angle α of 30° is high compared to the sample with a taper angle α of 75°. The Q value of the sample with a taper angle α of 30° is improved especially in frequencies equal to or higher than that of the resonance point. As described, the production of cracks is prevented and the Q value is improved by making the taper angle α 60° or less.

Figure 21A:
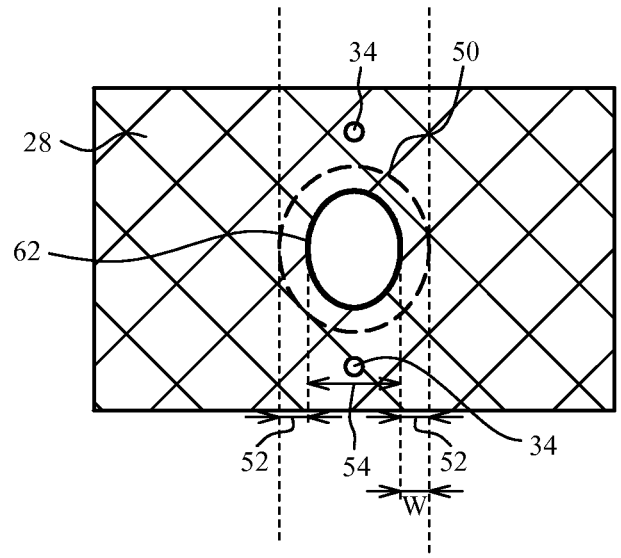
FIG. 21A through FIG. 21C are plan views of a piezoelectric thin film resonator (No. 1)
Figure 21B:
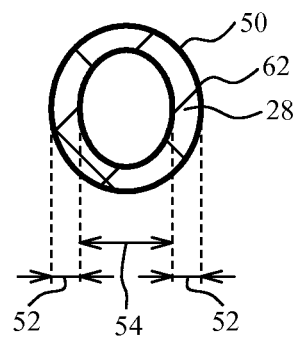
Figure 21C:
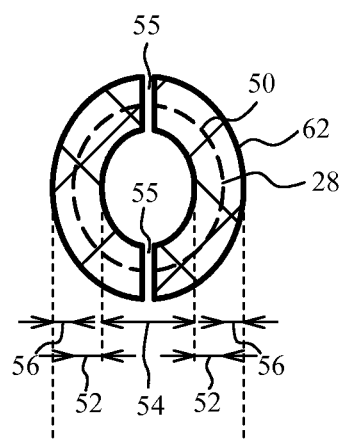
Figure 22A:
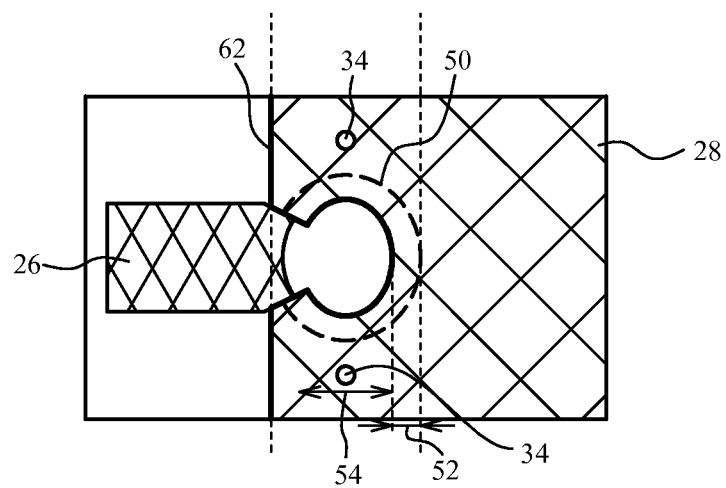
FIG. 22A through FIG. 22B are plan views of the piezoelectric thin film resonator (No. 2).
Figure 22B:
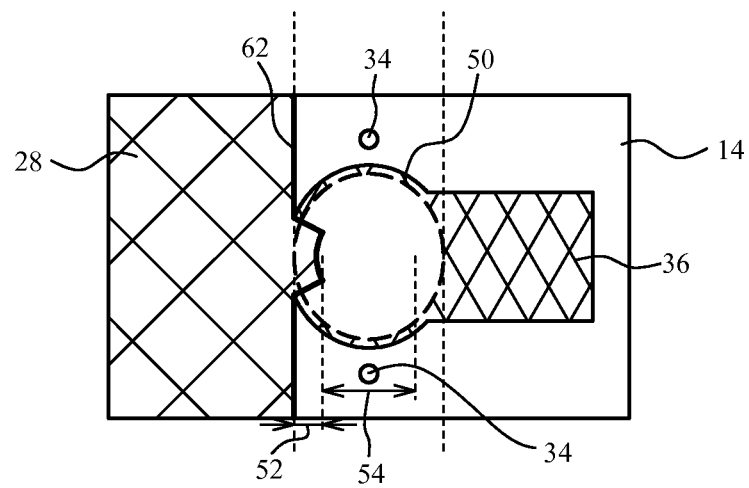

FIG. 21A through FIG. 22B are plan views of piezoelectric thin film resonators. FIG. 21A through FIG. 22B correspond to FIG. 1B of the first embodiment, FIG. 8B of the second embodiment, FIG. 9B of the third embodiment, FIG. 10B of the fourth embodiment, and FIG. 11B of the fifth embodiment, respectively. A bold solid line 62 represents that the side surface of the insertion film 28 is tapered. As illustrated in FIG. 21A, the eighth embodiment is applied to the first embodiment, and the side surface along the aperture formed in the insertion film 28 is tapered. As illustrated in FIG. 21B, in the second embodiment, the side surface along the outer periphery of the insertion film is tapered in addition to the side surface along the aperture formed in the insertion film 28. As illustrated in FIG. 21C, in the third embodiment, the side surface along the part 55 in which the insertion film 28 is not located is tapered. As illustrated in FIG. 22A, in the fourth embodiment, the side surface of the insertion film 28 is tapered. As illustrated in FIG. 22B, in the fifth embodiment, the side surface of the insertion film 28 is tapered.

As described above, the eighth embodiment can be applied to the first through sixth embodiments. Cracks produced in and near the resonance region 50 cause problems. Thus, the side surface of the insertion film 28 in and near the resonance region 50 is tapered, and the rest of the side surface of the insertion film 28 may be not tapered. The piezoelectric thin film resonator of the eighth embodiment may be used for a filter or a duplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film located on the substrate;
   a lower electrode and an upper electrode facing each other across at least a part of the piezoelectric film; and
   an insertion film that is inserted into the piezoelectric film, is located in at least a part of an outer periphery region in a resonance region in which the lower electrode and the upper electrode face each other across the piezoelectric film, and is not located in a center region of the resonance region,
   wherein the insertion film is located from the at least a part of the outer periphery region to an outside of the resonance region,
   wherein the insertion film is exposed from a side surface of the piezoelectric film.

2. The piezoelectric thin film resonator according to claim 1, wherein
   the insertion film has a Young's modulus less than a Young's modulus of the piezoelectric film.

3. The piezoelectric thin film resonator according to claim 1, wherein
   the piezoelectric film is composed mainly of aluminum nitride.

4. The piezoelectric thin film resonator according to claim 3, wherein
   the insertion film is composed mainly of at least one of Al, Au, Cu, Ti, Pt, Ta, Cr, and silicon oxide.

5. The piezoelectric thin film resonator according to claim 1, wherein
   the insertion film is a metal film.

6. The piezoelectric thin film resonator according to claim 1, wherein $T1/T2 \leq 0.2$ where T1 represents a film thickness of the insertion film and T2 represents a film thickness of a multilayered film in the center region.

7. The piezoelectric thin film resonator according to claim 1, wherein
   a width of the insertion film in the resonance region of the insertion film is equal to or less than 2.5 times a wavelength of an acoustic wave in a thickness extension mode of the piezoelectric thin film resonator.

8. The piezoelectric thin film resonator according to claim 1, wherein
   a width of the insertion film in the resonance region of the insertion film is equal to or less than 1.5 times a wavelength of an acoustic wave in a thickness extension mode of the piezoelectric thin film resonator.

9. The piezoelectric thin film resonator according to claim 1, wherein
   an air-space is formed between the substrate and an insulating film making contact with the lower electrode or the lower electrode in the resonance region.

10. The piezoelectric thin film resonator according to claim 1, further comprising:
    an acoustic reflection film reflecting an acoustic wave propagating through the piezoelectric film under the lower electrode in the resonance region.

11. The piezoelectric thin film resonator according to claim 1, wherein
    a side surface of the insertion film is tapered so that an upper surface of the insertion film is smaller than a bottom surface thereof.

12. The piezoelectric thin film resonator according to claim 11, wherein
    an angle between the bottom surface of the insertion film and the side surface thereof is 60° or less.

13. A filter comprising:
    a piezoelectric thin film resonator according to claim 1.

14. A duplexer comprising:
    a transmit filter; and
    a receive filter, wherein
    at least one the transmit filter and the receive filter is a filter according to claim 13.

15. A piezoelectric thin film resonator comprising:
    a substrate;
    a piezoelectric film located on the substrate;
    a lower electrode and an upper electrode facing each other across at least a part of the piezoelectric film; and
    an insertion film that is inserted into the piezoelectric film, is located in at least a part of an outer periphery region in a resonance region in which the lower electrode and the upper electrode face each other across the piezoelectric film, and is not located in a center region of the resonance region,
    wherein the insertion film is not located in a region other than the resonance region.

16. A piezoelectric thin film resonator comprising:
    a substrate;
    a piezoelectric film located on the substrate;
    a lower electrode and an upper electrode facing each other across at least a part of the piezoelectric film; and
    an insertion film that is inserted into the piezoelectric film, is located in at least a part of an outer periphery region in a resonance region in which the lower electrode and the upper electrode face each other across the piezoelectric film, and is not located in a center region of the resonance region,
    wherein a slit from the center region of the resonance region to an outside of the resonance region is formed in the insertion film.

17. A piezoelectric thin film resonator comprising:
    a substrate;
    a piezoelectric film located on the substrate;
    a lower electrode and an upper electrode facing each other across at least a part of the piezoelectric film; and
    an insertion film that is inserted into the piezoelectric film, is located in a part of an outer periphery region in a resonance region in which the lower electrode and the upper electrode face each other across the piezoelectric film, and is not located in a center region of the resonance region,
    wherein a width of the insertion film in a region other than the resonance region is larger than a width of the insertion film in the resonance region.

18. A filter comprising a plurality of piezoelectric thin film resonators, each of the plurality of piezoelectric thin film resonators comprising:
    a substrate;
    a piezoelectric film located on the substrate;
    a lower electrode and an upper electrode facing each other across at least a part of the piezoelectric film; and
    an insertion film that is inserted into the piezoelectric film, is located in a part of an outer periphery region in a resonance region in which the lower electrode and the upper electrode face each other across the piezoelectric film, and is not located in a center region of the resonance region, wherein the plurality of piezoelectric thin film resonators share a single insertion film as the insertion film.

* * * * *